(12) United States Patent
Hwang et al.

(10) Patent No.: US 7,202,464 B2
(45) Date of Patent: Apr. 10, 2007

(54) OPTICAL BENCH, SLIM OPTICAL PICKUP EMPLOYING THE SAME AND METHOD OF MANUFACTURING THE OPTICAL BENCH

(75) Inventors: Woong-lin Hwang, Gunpo-si (KR); Hyung Choi, Seongnam-si (KR); Jae-ho You, Seoul (KR); Yong-sung Kim, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 94 days.

(21) Appl. No.: 11/049,896

(22) Filed: Feb. 4, 2005

(65) Prior Publication Data

US 2005/0173614 A1  Aug. 11, 2005

(30) Foreign Application Priority Data

Feb. 7, 2004  (KR) ...................... 10-2004-0008173

(51) Int. Cl.
*H01J 40/14* (2006.01)
*G02B 27/64* (2006.01)
*G02B 27/40* (2006.01)
*G02B 7/04* (2006.01)

(52) U.S. Cl. ............................... 250/214.1; 250/201.5; 369/112.27; 369/44.12

(58) Field of Classification Search ............. 250/214.1, 250/201.5, 238–239; 369/44.11–44.42, 112.01–112.29
See application file for complete search history.

(56) References Cited

U.S. PATENT DOCUMENTS

2004/0105378 A1* 6/2004 Katou et al. ................. 369/121
2005/0094534 A1* 5/2005 Yoon et al. ............. 369/112.01

FOREIGN PATENT DOCUMENTS

JP          11-134703 A    5/1999
JP          2002-228893 A  8/2002

* cited by examiner

*Primary Examiner*—Stephone B. Allen
*Assistant Examiner*—Patrick J. Lee
(74) *Attorney, Agent, or Firm*—Sughrue Mion, PLLC

(57) ABSTRACT

An optical bench is provided, as are a thin optical pickup that employs the optical bench, and a method of manufacturing the optical bench. The optical bench includes a light source for generating light for recording and reproducing information to and from an optical disc, a light source stand on which the light source is mounted, a mirror adjacent to the light source stand, and a bottom surface at a lower point than the light source stand and between the light source stand and the mirror surface. Sides of the light source stand besides the side facing the mirror are connected to the surface of the substrate by a flat sloped surface. Along the sloped surface, two electrodes for supplying power to the light source are connected to the light source stand. Since the metal wirings are formed along the sloped surface without trenches or windings between the light source stand and the silicon substrate, no disconnection of metal lines at a corner occurs.

13 Claims, 9 Drawing Sheets

OPTICAL BENCH, SLIM OPTICAL PICKUP EMPLOYING THE SAME AND METHOD OF MANUFACTURING THE OPTICAL BENCH

BACKGROUND OF THE INVENTION

This application claims priority from Korean Patent Application No. 10-2004-0008173, filed on Feb. 7, 2004 in the Korean Intellectual Property Office, the disclosure of which is incorporated herein in its entirety by reference.

1. Field of the Invention

The present invention relates to an optical pickup, and more particularly, to an optical bench, on which metal wirings and optical parts can be formed, disposed on a substrate on which a photo detector and a silicon optical bench (SiOB) are monolithically formed, a thin optical pickup that employs the optical bench, and a method of manufacturing the optical bench.

2. Description of the Related Art

Recently, the use of mobile information devices such as PDAs, mobile phones, digital cameras, and camcorders has rapidly increased. To record and read data to and from such information devices, optical pickup devices are essential, and techniques of producing optical pickups for mobile information devices that have become further miniaturized are being developed.

FIGS. 1A and 1B are respectively a perspective view and a cross-sectional view illustrating an optical bench used for a conventional thin optical pickup.

The conventional optical bench includes a silicon substrate 12, a light source stand 20, a metal wiring 14 formed on the silicon substrate 12 and the light source stand 20, bonding pads 22, and solder pads 16.

In a conventional silicon optical bench, a light source such as a laser diode is mounted on the light source stand 20, and light emitted from the light source is incident on a 45° tilted mirror surface 24, which is a crystal surface of the silicon substrate 12 etched to have a {111} orientation. That is, a light beam emitted from the light source is spread out with a certain angle and then is incident on an Si{111} mirror surface with a predetermined spot size. Accordingly, if the light source stand 20 does not have a predetermined height with respect to a bottom surface 30 of the substrate 12 between the light source stand 20 and the mirror surface, some of the light emitted from the light source can not reach the mirror and is lost when it hits the bottom surface 30 of the substrate 12.

Therefore, in order for all the light emitted from the light source within a predetermined angle to reflect from the mirror surface 24 without loss, the light source stand 20 must have a certain height with respect to the bottom surface 30 of the silicon substrate 12. An electrode for supplying power to the laser diode is formed on the light source stand 20, and the light source of the laser diode is a flip-chip bonded by a solder bumper 16 composed of Au/Sn on the electrode.

In order to form a step difference between the bottom surface 30 of the silicon substrate 12 and the light source stand 20, the light source stand 20 is formed by dry etching (for example, reactive ion etching) the silicon substrate 12, and then, the mirror surface 24 having a 45° tilted Si{111} crystal surface 24 and the bottom surface 30 are formed by wet etching. The reason that light source stand 20 is formed by dry etching is to prevent the formation of a hollowed groove parallel to a surface of the silicon substrate 12.

However, conventionally, due to the sequence of processes, such a deep trench is inevitably formed in the vicinity of the light source stand 20.

FIG. 2A is a cross-sectional view illustrating a problem that occurs when a metal wiring is formed on an optical bench used for a conventional thin film optical pickup by wet etching.

Referring to FIG. 2A, after forming a metal layer on a silicon substrate 12 to form a metal wiring 14, when coating a photoresist for patterning the metal layer to the metal wiring 14 using spin coating or spray coating, the portion of the photoresists at the corner portions A and B are peeled off.

After patterning the photoresist using a lithography process, the metal layer must be wet etched using the patterned photoresist as a mask. At this time, the portion of the metal layer an the corner portions A and B are removed. Therefore, the metal wiring is not connected at the corner portions A and B. Also, in the deep trench formed in the vicinity of the light source stand 20, the photoresist may remain after developing due to insufficient exposure.

FIG. 2B is a cross-sectional view illustrating a problem that occurs when performing a lift-off process for forming a metal wiring on an optical bench used for a conventional thin film optical pickup.

FIG. 2B illustrates a problem that occurs when performing a lift-off process to avoid the wet etching problem depicted in FIG. 2A. After coating a photoresist on an insulating film 18 on the silicon substrate 12, the photoresist is patterned to a shape opposite to the metal wiring 14, and then, a metal layer is deposited on the patterned photoresist. At this time, the photoresist is generally coated thickly on the bottom surface of the deep trench, and developing can not be sufficiently performed since an insufficient amount of light reaches the bottom of the deep trench or the process may take a long time. If the developing is performed excessively to remove the photoresist in the trench, too much of the photoresist on the surface of the silicon substrate 12 is removed resulting in an increased width of the metal wiring which can cause difficulty for maintaining a gap between wirings. If the developing is not sufficient, since the photoresist remaining in the trench C can not be removed completely, the metal wiring 14 is removed when removing the photoresist in a subsequent lift-off process, thereby disconnecting the metal wiring 14.

SUMMARY OF THE INVENTION

The present invention provides an optical bench in which metal wiring between an optical bench and a surface of a silicon substrate can be formed by only one process, a thin optical pickup using the same and a method of manufacturing the thin optical bench.

According to an aspect of the present invention, there is provided an optical bench comprising: a light source generating light for recording or reproducing information to or from an optical disc; a photo detector receiving the light; a light source stand on which a light source is mounted; a mirror facing the light source stand; and a bottom surface between the light source stand and the mirror surface, wherein a surface on which the photo detector is formed and the light source stand are connected by a first sloped surface, and the light source stand and the bottom surface are connected by a second sloped surface.

According to another aspect of the present invention, there is provided a method of forming an optical bench, comprising: dry etching a region of a silicon substrate to a first depth to form a light source stand mounting a light source on a silicon substrate on which a photo detector is mounted; and forming a mirror and a bottom surface in front of the light source stand by wet etching the dry etched silicon substrate using a wet etch mask having a compensation pattern, wherein the an upper surface of the substrate on which the photo detector is formed and the light source stand is connected by a first sloped surface, and the light source stand and the bottom surface is connected by a second sloped surface.

According to still another aspect of the present invention, there is provided a thin optical pickup that records and reproduces information to and from an optical disc, comprising: a light source generating light; a photo detector receiving the light; an optical element irradiating the light to the optical disc; an optical bench comprising a light source stand on which the light source is mounted, and a mirror reflecting light to the optical element, disposed in front of the light source stand; a bottom surface between the light source stand and the mirror surface; a heat radiation means combined to a surface of the optical bench; and a supporting means comprising a plurality of bonding pads facing the heat radiation means with the optical bench interposed therebetween, wherein a surface on which the photo detector is formed and the light source stand are connected by a first sloped surface, and the light source stand and the bottom surface are connected by a second sloped surface.

BRIEF DESCRIPTION OF THE DRAWINGS

The above and other aspects of the present invention will become more apparent by describing in detail exemplary embodiments thereof with reference to the attached drawings in which.

DETAILED DESCRIPTION OF EXEMPLARY EMBODIMENTS OF THE INVENTION

Figure 1A:
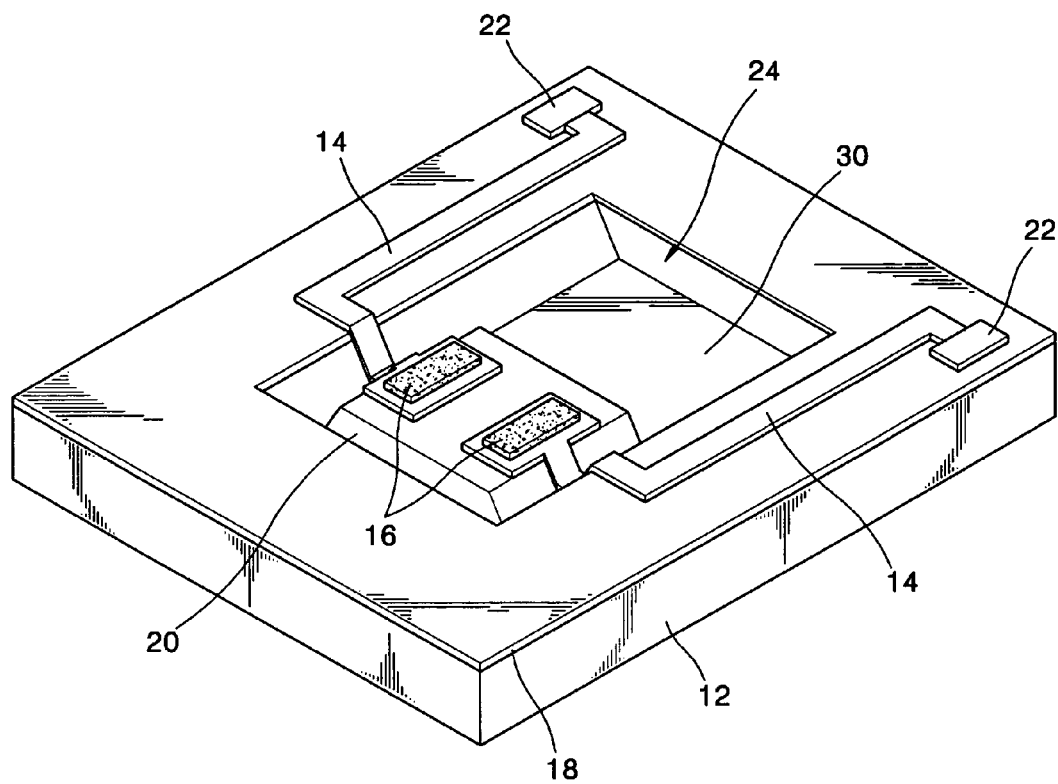
FIG. 1A is a perspective view of an optical bench used for a conventional thin optical pickup.
Figure 1B:
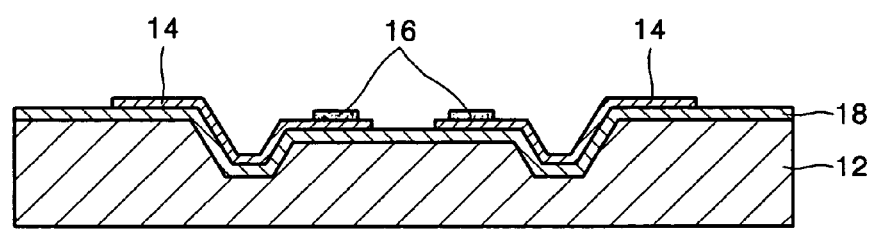
FIG. 1B is a cross-sectional view of the optical bench of FIG. 1A.
Figure 2A:
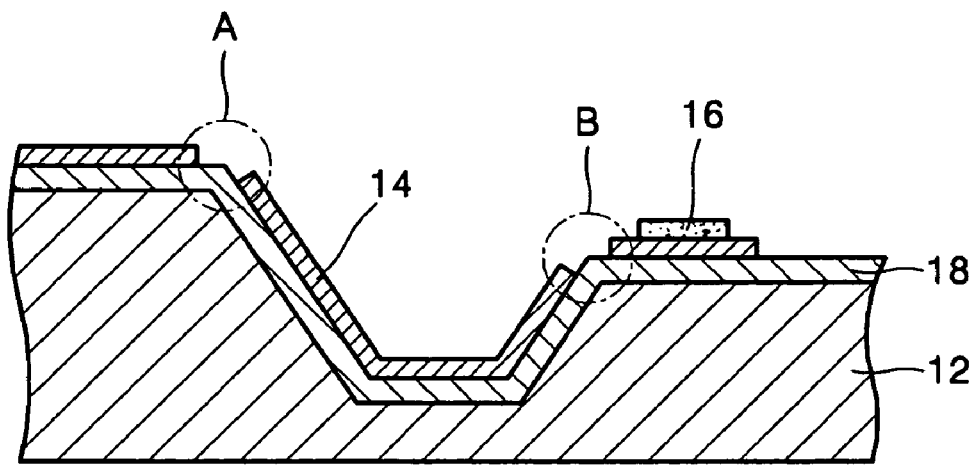
FIG. 2A is a cross-sectional view illustrating a problem that occurs when forming a metal wiring on an optical bench used for a conventional thin film optical pickup by wet etching.
Figure 2B:
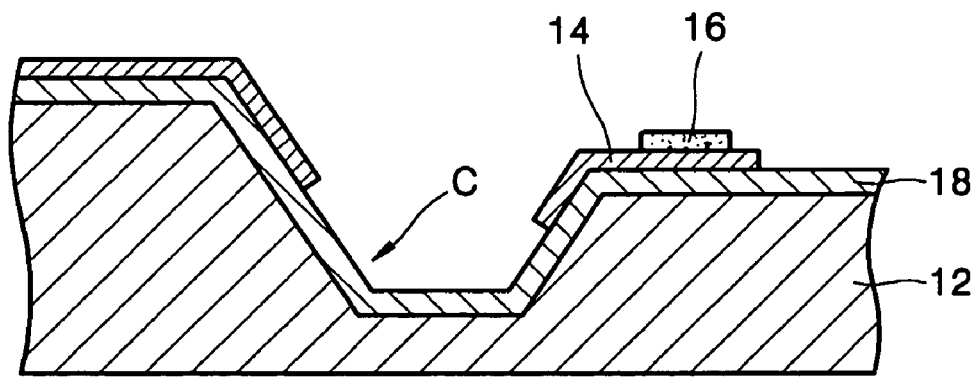
FIG. 2B is a cross-sectional view illustrating a problem that occurs when performing a lift-off process for forming a metal wiring on an optical bench used for a conventional thin film optical pickup.

The present invention will now be described more fully with reference to the accompanying drawings in which exemplary embodiments of the present invention are shown. Like reference numerals refer to like elements throughout the drawings.

Figure 3A:
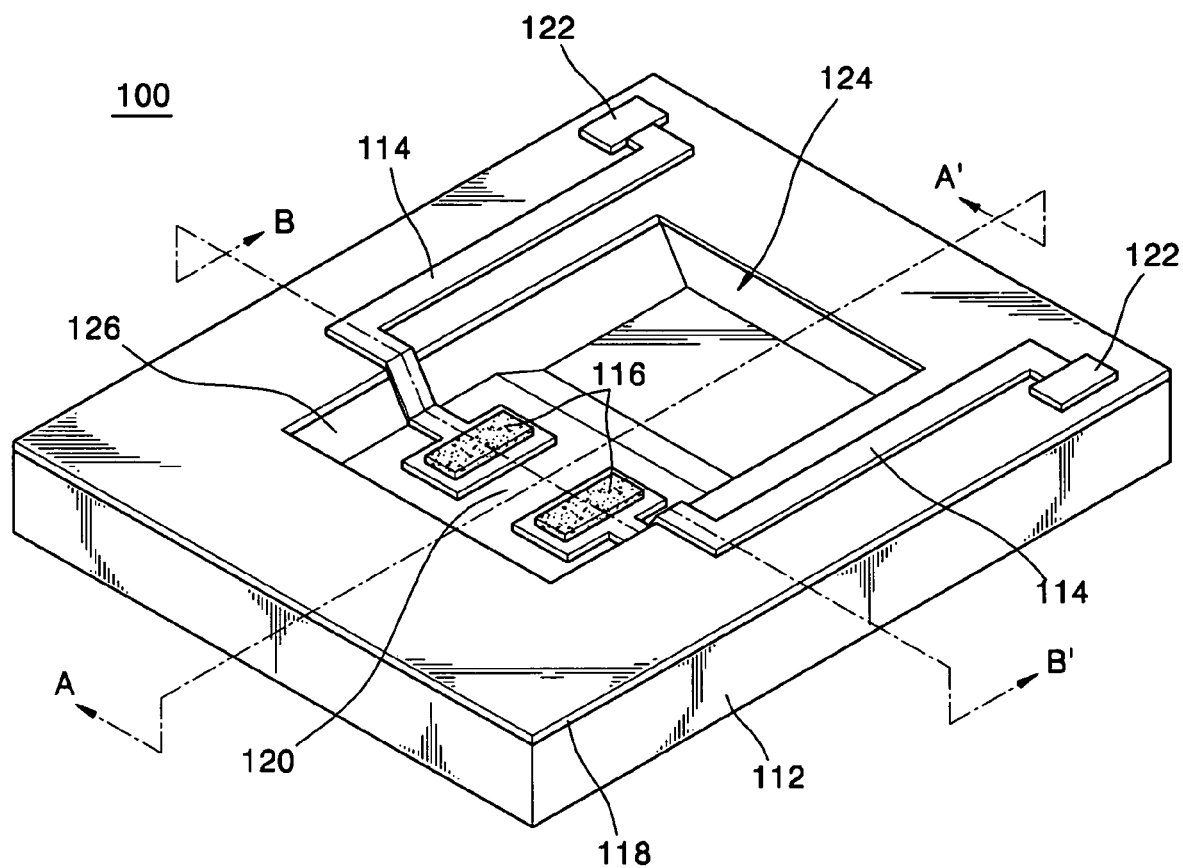
FIG. 3A is a perspective view of an optical bench for use in a thin optical pickup according to an exemplary embodiment of the present invention.
Figure 3B:
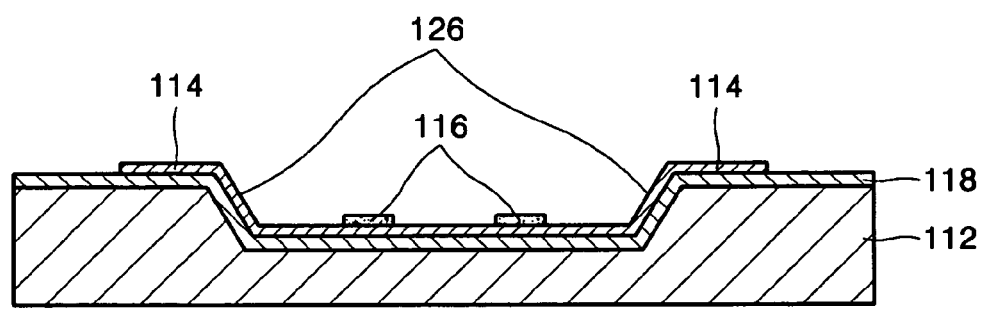
FIG. 3B is a cross-sectional view of the optical bench of FIG. 3A.

FIGS. 3A and 3B are respectively a perspective view and a cross-sectional view illustrating an optical bench for use in a thin optical pickup according to an exemplary embodiment of the present invention.

Referring to FIGS. 3A and 3B, an optical bench 100 according to an exemplary embodiment of the present invention comprises a light source stand 120 and a mirror surface 124 on a silicon substrate 112 on which a multi-segment photo detector and a monitoring photo diode are formed. The mirror surface 124 is an Si{111} crystal surface tilted by 45° naturally formed by wet etching using an Si{100} silicon wafer tilted by 9.74°.

For simplicity, the multi-segment photo detector and the monitoring photo diode are not shown in FIGS. 3A and 3B. These elements will be described in detail with reference to FIG. 7. In FIGS. 3A and 3B, the metal wirings 114 for the laser diode on the light source stand are disposed along left and right sloped walls of the light source stand 120. However, the metal wirings 114 can be formed along any sloped walls 126 of the light source stand 120 except those disposed along the mirror direction of the light source stand 120. The location of the wirings 114 may vary slightly according to a layout design of the multi-segment photo detector and bond pads on the surface of the silicon substrate 112.

FIGS. 4A through 4F are cross-sectional views illustrating a method of manufacturing an optical bench for use in a thin optical pickup according to an exemplary embodiment of the present invention.

Left figures in the drawings are cross-sectional views taken along A–A' in FIG. 3A, and right figures in the drawings are cross-sectional views taken along B–B' in FIG. 3A.

Figure 4A:
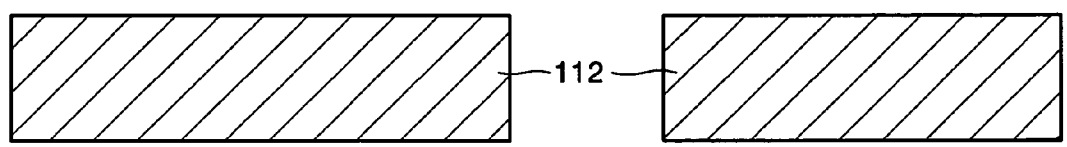
FIGS. 4A through 4F are cross-sectional views illustrating a method of manufacturing an optical bench for using in a thin optical pickup according to an exemplary embodiment of the present invention.
Figure 4B:
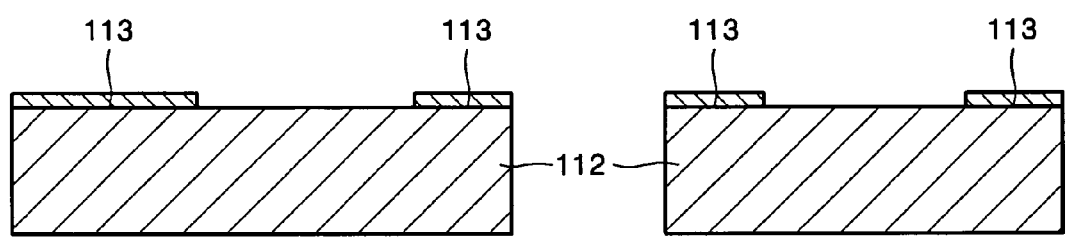

Referring to FIG. 4A, a silicon substrate 112 having an Si{100} crystal surface tilted by 9.74° is prepared. Referring to FIG. 4B, a mask 113 for dry etching is formed on the silicon substrate 112 to make the light source stand parallel to the surface of the substrate 112. The mask 113 can be composed of a photoresist and formed using a lithography process.

Figure 4C:
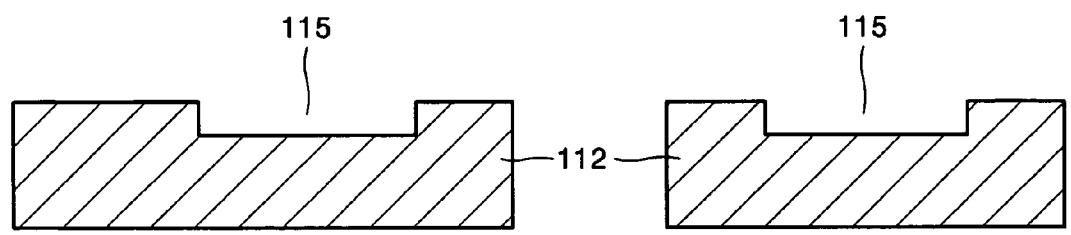

Referring to FIG. 4C, a light source stand region 115 is formed by dry etching the silicon substrate 112 using reactive ion etching (RIE).

Figure 4D:
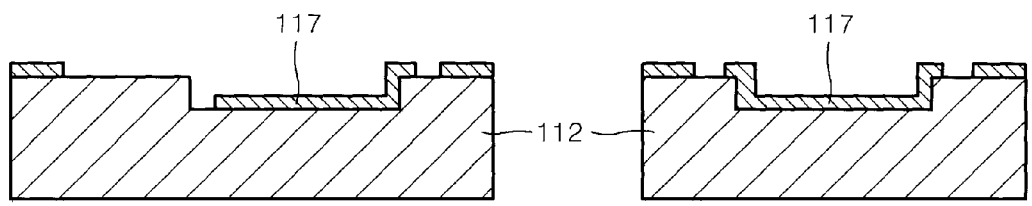

Referring to FIG. 4D, a wet etching protective mask 117 is formed on the dry etched silicon substrate 112. The wet etching protective mask 117 of the present exemplary embodiment will be described in more detail with reference to FIGS. 5A through 6B.

Figure 4E:
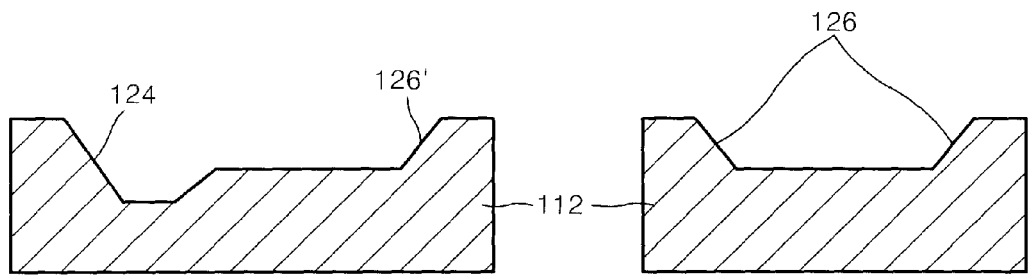

Referring to FIG. 4E, a mirror surface 124, an optical stand and slopes 126 and 126' are formed in the silicon substrate 112 by wet etching the dry etched silicon substrate 112.

Figure 4F:
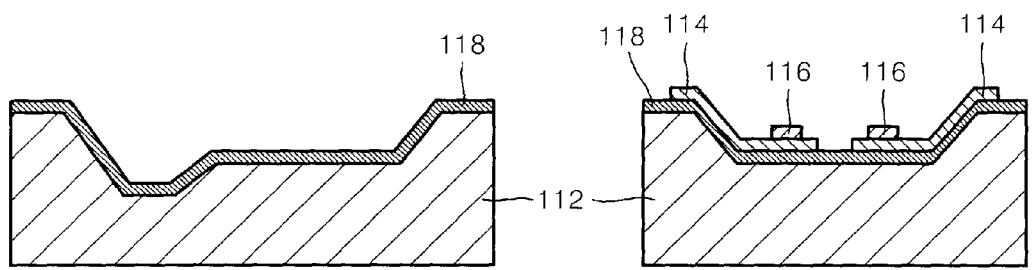

Referring to FIG. 4F, an insulating layer 118, metal wirings 114, and solder bumps 116 for flip-chipping a laser diode are sequentially formed on the wet etched silicon substrate 112.

Figure 5A:
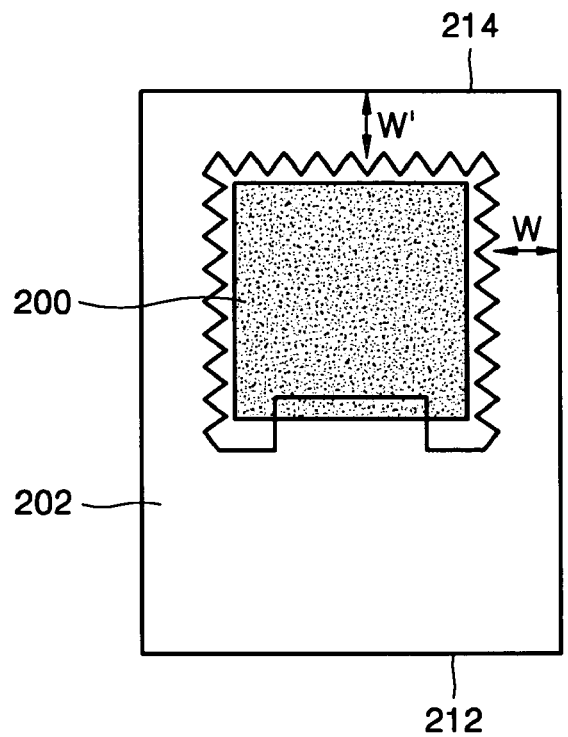
FIGS. 5A and 5B are drawings illustrating a photomask pattern for manufacturing an optical bench according to an exemplary embodiment of the present invention.
Figure 5B:
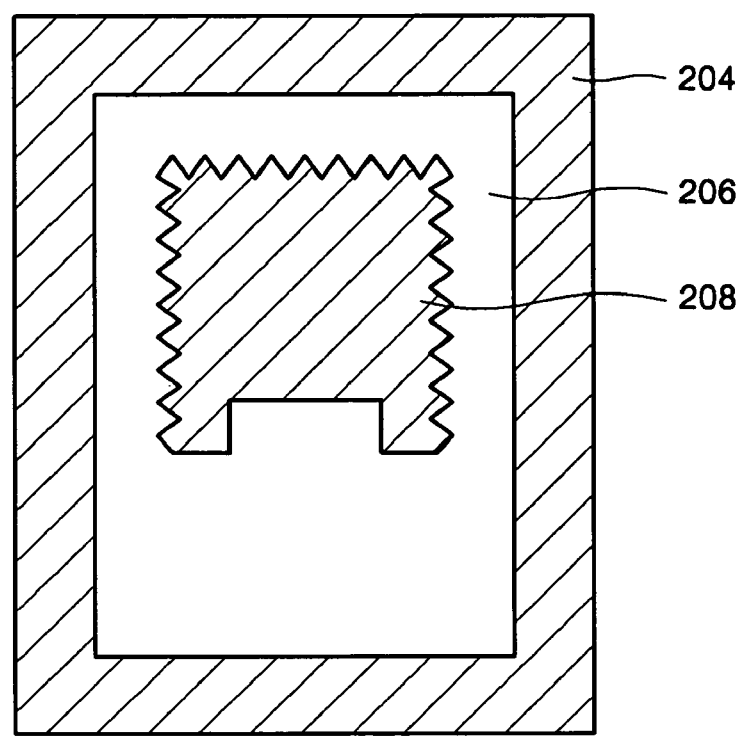

FIGS. 5A and 5B illustrate a photomask for manufacturing an optical bench according to an exemplary embodiment of the present invention. FIGS. 5A and 5B illustrate a shape of the silicon substrate, a shape of a wet etching protective layer formed on the silicon substrate, and a corner compensating pattern for forming the protective film after dry etching the substrate. The corner compensating pattern acts as a protective barrier for protecting corner portions from etching due to a wet etching liquid penetrating the corners.

Referring to FIGS. 5A and 5b, reference numeral 200 represents a dry etched region of the silicon substrate 112 and reference numeral 202 represents a region of the silicon substrate 112 to be wet etched.

Reference numeral 212 represents a region where an Si{111} mirror surface tilted 45° is to be formed and reference numeral 214 represents a region where a wall sloping at an angle of 64.48° with respect to the surface of the substrate and facing the mirror surface is to be formed.

Slopes of walls on both the left and right sides of the mirror surfaces have angles of 55.6° with respect to the surface of the substrate. Accordingly, a dry etching depth d and wet etching widths w and w' are related such that a line of sloped surface formed by wet etching can match to a line of sloped surface formed by dry etching.

In FIG. 5A, when the silicon substrate 112 has a {100} crystal surface, the silicon substrate 112 is a silicon wafer having a slope of 9.74°, and the region 212 is a region where the 45° Si{111} mirror surface is to be formed, the relationship between the wet etching widths w and w' and the dry etching depth d is determined by the following formula:

$$Y = \frac{d}{\tan\theta} \qquad [\text{Formula 1}]$$

When Y is w, θ=55.6°, and Y is w', θ=64.48°.

FIG. 5B illustrates a wet etching protective photomask pattern according to an exemplary embodiment of the present invention. The wet etching protective photomask pattern has regions 204 and 208. Region 206 is to be wet etched. The zigzagged line, shaped as a saw tooth, in the region 208 prevents commencing of the formation of an Si{111} crystal surface by wet etching. This line can have any shape except a straight line.

Figure 6A:
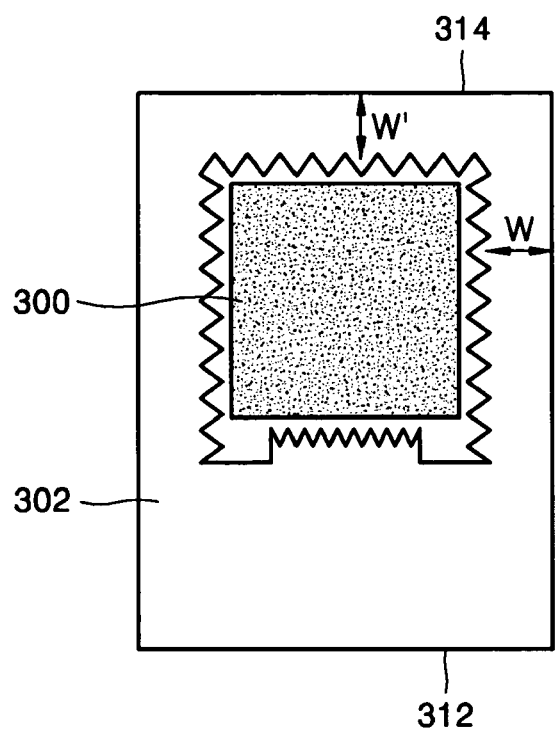
FIGS. 6A and 6B are drawings illustrating a photomask pattern for manufacturing an optical bench according to another exemplary embodiment of the present invention.
Figure 6B:
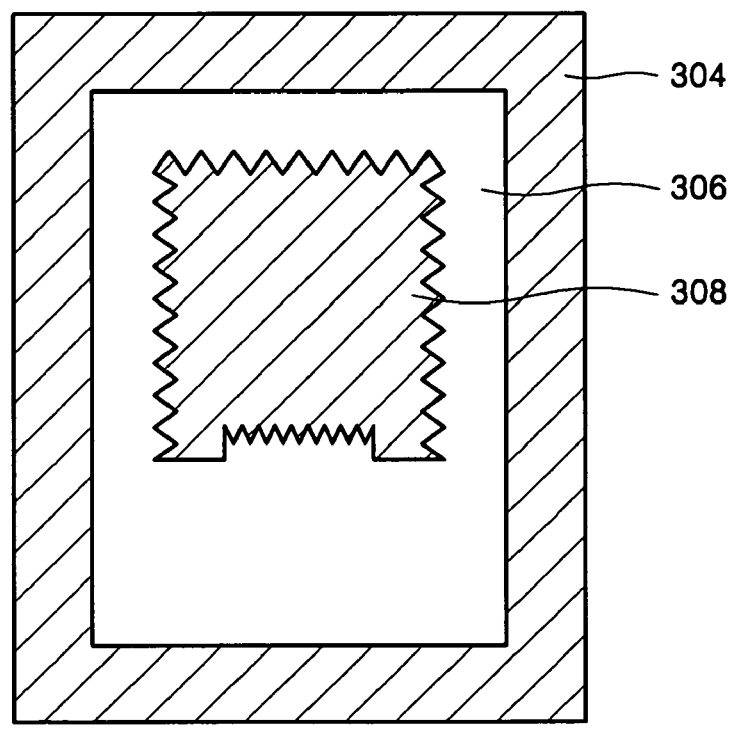

FIGS. 6A and 6B are drawings illustrate a photomask pattern for manufacturing an optical bench according to another exemplary embodiment of the present invention. The photomask covers a portion of a silicon substrate that has been dry etched, and outlines a shape of a wet etching protective layer formed on the silicon substrate and a compensating pattern for protecting corner portions used for forming the wet etching protective layer.

The photomask includes a region 300 that has been dry etched, a region 302 for wet etching, a region 312 for forming a mirror surface, and a region 314 for forming an opposite surface of the mirror. The relationship between the wet etching widths w and w' and the dry etching depth d is determined by formula 1.

FIG. 6B illustrates a wet etching protective photomask pattern according to an exemplary embodiment of the present invention. The wet etching protective photomask pattern has regions 304 and 308. Region 306 is to be wet etched. The zigzagged line, shaped as a saw tooth, in the region 308 prevents commencing of the formation of an Si{111} crystal surface by wet etching. This line can have any shape except a straight line.

The difference between the photomask of FIG. 6A and FIG. 6B from the photomask of FIG. 5A and FIG. 5B is that the wet etching protective photomask pattern is not formed in one side of the dry etched region in the photomask of FIG. 5A and FIG. 5B. In this case, the initial formation of the second slope occurs at a mirror side of the dry etched region. If the mirror side of the dry etched region, after proper etching, can perform the function of an etch stop line at which an Si{111} slope surface is begun by wet etching, a lithography process can be simply performed since the formation of a pattern on the dry-etched surface on which a step difference exists, as in FIG. 5A, is unnecessary.

In the present exemplary embodiment, the portion of the photomask used as a wet etching protective photomask has a saw tooth shape, but it can have a variety shapes as long as it can prevent the formation of the Si{111} crystal surface. The photomask can be greater than the dry etching regions 200 and 300 and is placed on the regions 202 and 302 for wet etching.

Figure 7:
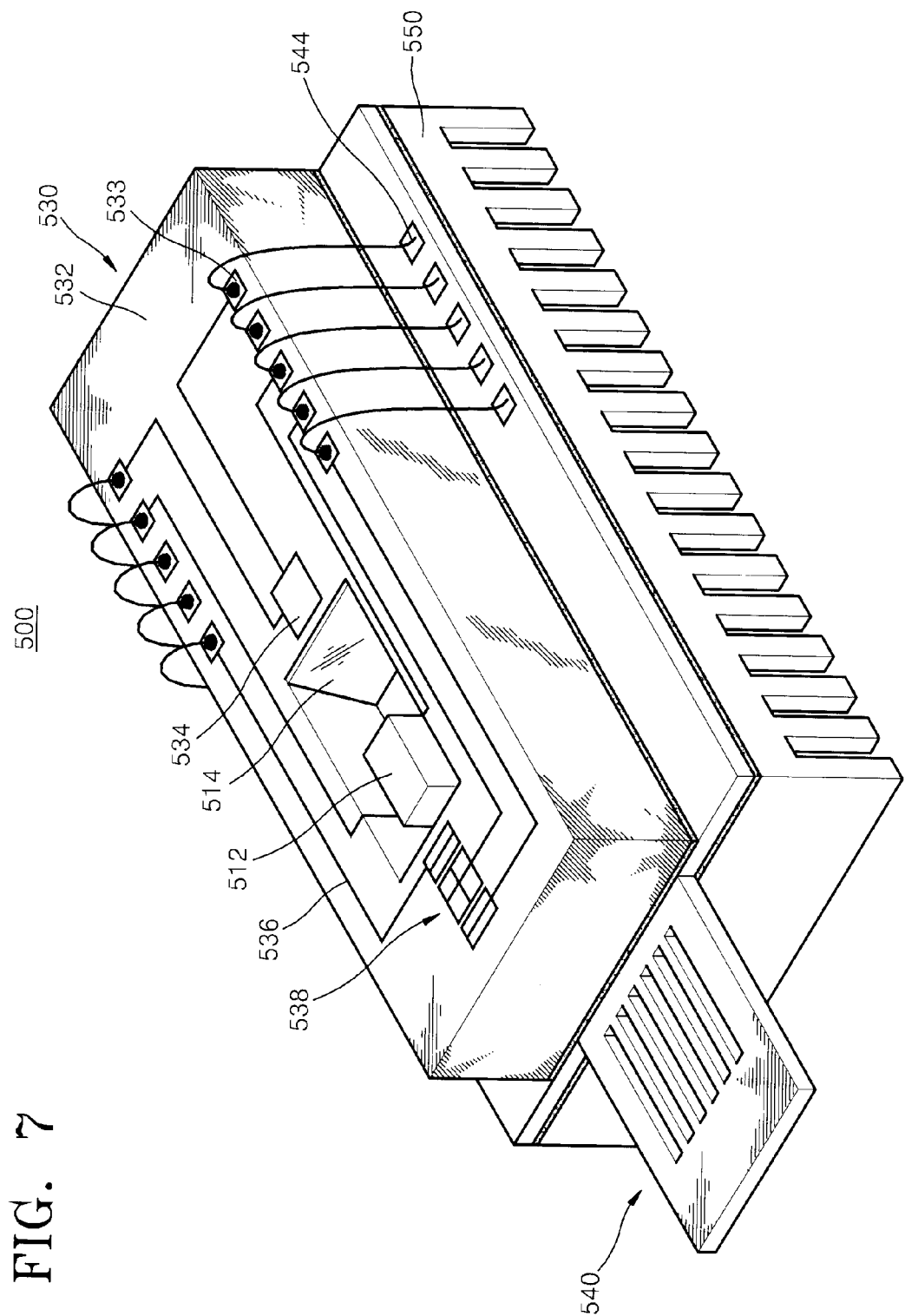
FIG. 7 is a perspective view of a thin optical pickup using an optical bench according to an exemplary embodiment of the present invention.
Figure 8:
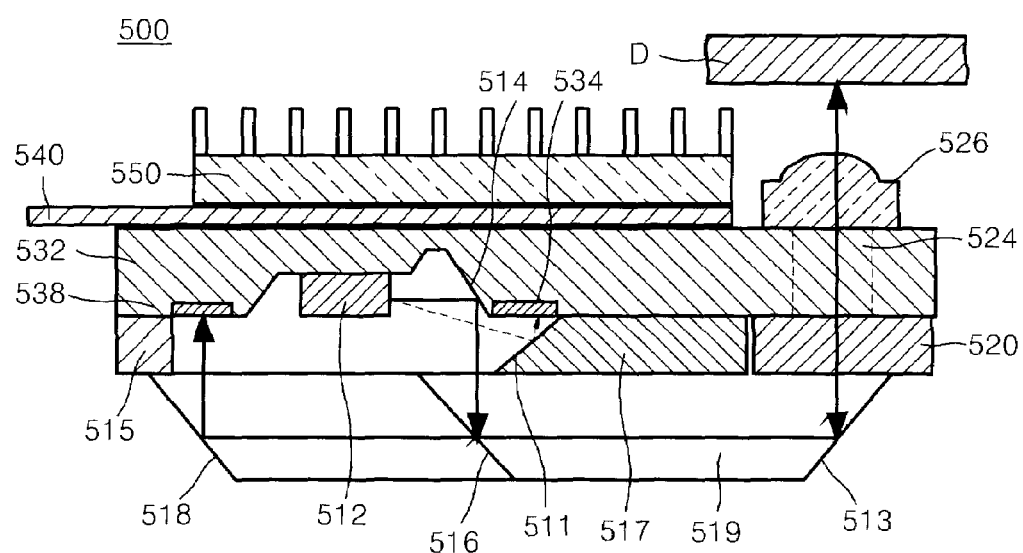
FIG. 8 is a cross-sectional view illustrating the thin optical pickup shown in FIG. 7.

FIG. 7 is a perspective view of a thin optical pickup using an optical bench according to an exemplary embodiment of the present invention, and FIG. 8 is a cross-sectional view of a thin optical pickup shown in FIG. 7.

Referring to FIGS. 7 and 8, a thin film optical pickup 500 comprises a light source 512 such as a laser diode, a monitoring photo diode 534, a silicon optical bench (SiOB) 530 that includes a slope mirror 514 and a multi-segment photo detector 538, a polarizing beam splitter 516, a prism element 519 that includes first and second reflection surfaces 513 and 518, a hologram optical element (HOE) 520, an objective lens 526 attached to a predetermined region of a back surface of the SiOB 530 facing the HOE 520, a leaf spring 540 attached to the back surface of the SiOB 530, and a heat radiation plate 550 formed on a surface of the leaf spring 540.

After forming the multi-segment photo detector 538 and the monitoring photo diode 534 on the main substrate 532 composed of a silicon wafer with a {100} crystal surface sloped at 9.74°, a light source stand on which a light source such as a laser diode will be placed and the slope mirror 514 composed of Si{111} crystal surface are formed by dry etching and wet etching.

The light source 512 is flip-chip bonded to the light source stand. The multi-segment photo detector 538 has a plurality of photodiodes. The photodiodes of the multi-segment photo detector 538 are connected to respective bonding pads 533 on the SiOB 530 by the metal lines 536 for laser diode wiring.

The leaf spring 540 attached to the back surface of the SiOB 530 is composed of stainless steel (SUS) and controls a motor and a head combined therewith. Bond pads 544 formed on an upper surface of the leaf spring 540 are wire bonded to the bond pads 533 on the SiOB 530. The wirings are electrically connected to outside devices via the metal line 536 formed on the SiOB 530.

A second spacer 517 on which a monitoring mirror 511 facing the monitoring photodiode 534 is formed and a first spacer 515 which is mounted on a peripheral area of the multi-segment photo detector 538 are mounted on the SiOB 530.

A prism element 519, on which first and second reflection surfaces are formed at both ends and a polarizing beam splitter 516 is mounted on the center, is mounted on the first and second spacers 515 and 517. The HOE 520 is interposed between a first reflection side of the prism element 519 and the SiOB 530. The objective lens 526 is mounted on a side of the SiOB 530 opposite to the side of the SiOB 530 on which the HOE 520 is mounted.

The heat radiation plate 550 is mounted on a surface of the leaf spring 540 opposite to the surface of the leaf spring 540 on which the SiOB 530 is formed. The thin optical pickup 500 having a structure in which the leaf spring 540 is interposed between a heat radiation plate 550 and the SiOB 530 has been described, however, the leaf spring 540 can be mounted on an upper surface of the SiOB 530.

The operation of the thin optical pickup 500 according to an exemplary embodiment of the present invention will now be described.

A laser beam emitted from the light source 512 is totally reflected in a direction perpendicular to the substrate by the slope mirror 514. A portion of the laser beam emitted at a large enough angle is not reflected by the mirror 514 but enters the monitoring photo diode 534 after reflecting from a monitoring mirror 511, which monitors the intensity of the light emitted by the light source 512.

The light reflected perpendicularly with respect to the substrate by the mirror 514 of the SiOB 530 enters the HOE 520 after reflecting from the polarizing beam splitter 516 and the first reflection surface 513 of the prism element 519. The light that enters the HOE 520 is focused to a point on an optical disc D by the objective lens 526.

The light reflected by the optical disc D is reflected by the first reflection surface 513 of the prism element 519 and then incident on the polarizing beam splitter 516. After passing the polarizing beam splitter 516, the laser beams enter the photo detector 538 after reflecting from the second reflection surface 518. The laser beams are transformed into electrical signals for measuring a tracking error, a focusing error, or an RF signal by the light detector 538.

According to exemplary embodiments of the present invention, since a light source stand for mounting a light source such as a laser diode is connected to an SiOB surface by a single sloped surface neither having trenches nor windings, a metal wiring can be formed by a single process of lithography without disconnections.

Also, according to exemplary embodiments of the present invention, the width of a silicon optical bench can be narrowed since additional width for a light source trench formed in a conventional method of manufacturing a light source stand using continuous dry etching and wet etching is not required. This is a very important advantage for a field such as a mobile devices in which driving of a motor with minimal power is needed.

As the length of an LD wiring decreases the resistance of the LD wiring decreases. Therefore, the shortened length of the LD wiring is a great advantage with respect to the radiation of heat and power consumption, especially, for a blue DVD pickup.

According to exemplary embodiments of the present invention, in a method of manufacturing an optical bench, since a region surrounding the light source stand having a smooth connecting structure without trenches or windings is formed, possible problems that can occur in the subsequent processes can be prevented, thereby improving reproducibility and productivity for mass production.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. An optical bench, comprising:
   a light source generating light for recording information to or reproducing information from an optical disc;
   a photo detector receiving the light;
   a light source stand on which the light source is mounted, wherein a surface on which the photo detector is formed and the light source stand are connected by a first sloped surface;
   a mirror disposed adjacent to the light source stand; and
   a bottom surface interposed between the light source stand and a surface of the mirror, wherein the light source stand and the bottom surface are connected by a second sloped surface.

2. The optical bench of claim 1, wherein the optical bench is formed from a silicon wafer having an Si{100} crystal surface tilted at an angle of 9.74°.

3. The optical bench of claim 2, wherein the mirror surface is formed from a silicon wafer having an Si{111} crystal surface tilted at an angle of 45°.

4. The optical bench of claim 1, further comprising a plurality of bonding pads formed on the same surface on which the photo detector is mounted for forming external electrical connections.

5. The optical bench of claim 4, wherein a plurality of metal lines for electrically connecting an electrode of the light source to the bonding pads are formed along the first sloped surface.

6. The optical bench of claim 1, wherein the sides of the light source stand except a side facing the mirror are connected to a substrate surface on which the photo detector is formed via a flat sloped surface without windings.

7. A thin optical pickup that records and reproduces information to and from an optical disc, comprising:
   a light source generating light;
   a photo detector receiving the light;
   an optical clement irradiating the light to the optical disc;
   an optical bench comprising a light source stand on which the light source is mounted, and a mirror reflecting light to the optical element, disposed in front of the light source stand, wherein a surface on which the photo detector is formed and the light source stand are connected by a first sloped surface;
   a bottom surface interposed between the light source stand and a surface of the mirror, wherein the light source stand and the bottom surface are connected by a second sloped surface;
   a heat radiation means combined to a surface of the optical bench; and
   a supporting means comprising a plurality of bonding pads facing the heat radiation means with the optical bench.

8. The thin optical pickup of claim 7, wherein the optical bench is formed from a silicon wafer having an Si{100} crystal surface tilted at an angle of 9.74°.

9. The thin optical pickup of claim 7, wherein the mirror surface is formed from an Si{111} crystal surface tilted at an angle of 45°.

10. The thin optical pickup of claim 7, further comprising a plurality of bonding pads formed on the same surface on which the photo detector is mounted for forming external electrical connections.

11. The thin optical pickup of claim 10, wherein a plurality of metal lines for electrically connecting an electrode of the light source to the bonding pads are formed along the first sloped surface.

12. The thin optical pickup of claim 7, further comprising:
   a polarized light device comprising first and second reflection surfaces and a polarizing beam splitter disposed facing the photo detector;
   a spacer interposed between the optical bench and the polarized light device;
   a hologram optical element; and
   an objective lens.

13. The thin optical pickup of claim 7, wherein the sides of the light source stand except a side facing the mirror are connected to a substrate surface on which the photo detector is formed via a flat sloped surface without windings.

* * * * *